US012777650B2

(12) United States Patent
Sun et al.

(10) Patent No.: US 12,777,650 B2
(45) Date of Patent: Oct. 27, 2026

(54) TRANSISTOR COUPLED TO TERMINALS FOR INJECTING CHARGE CARRIERS INTO PAIR OF SPACERS

(71) Applicant: GlobalFoundries Singapore Pte. Ltd., Singapore (SG)

(72) Inventors: Yongshun Sun, Singapore (SG); Eng Huat Toh, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 847 days.

(21) Appl. No.: 18/149,221

(22) Filed: Jan. 3, 2023

(65) Prior Publication Data

US 2024/0224528 A1 Jul. 4, 2024

(51) Int. Cl.

| | |
|---|---|
| ***H10B 43/30*** | (2023.01) |
| ***H10B 43/40*** | (2023.01) |
| ***H10D 30/01*** | (2025.01) |
| ***H10D 30/69*** | (2025.01) |
| ***H10D 64/01*** | (2025.01) |

(52) U.S. Cl.

CPC ............. *H10B 43/30* (2023.02); *H10B 43/40* (2023.02); *H10D 30/0413* (2025.01); *H10D 30/69* (2025.01); *H10D 64/021* (2025.01)

(58) Field of Classification Search

CPC .... H10B 43/30; H10B 43/40; H10D 30/0413; H10D 30/69; H10D 64/021

See application file for complete search history.

(56) References Cited

U.S. PATENT DOCUMENTS

| | | | | |
|---|---|---|---|---|
| 5,455,792 | A * | 10/1995 | Yi | H10D 30/685 365/185.15 |
| 5,978,269 | A * | 11/1999 | Bergemont | G11C 16/12 365/185.23 |
| 6,903,968 | B2 | 6/2005 | Jeng | |
| 7,227,234 | B2 | 6/2007 | Roizin et al. | |
| 8,574,979 | B2 * | 11/2013 | Sridhar | H10D 84/8311 438/300 |
| 9,484,072 | B1 | 11/2016 | Noda | |
| 2005/0199940 | A1 * | 9/2005 | Mine | H10D 64/037 257/315 |
| 2006/0125122 | A1 * | 6/2006 | Roizin | H10B 41/43 257/E21.21 |

(Continued)

OTHER PUBLICATIONS

Hsieh et al., "NVM Characteristics of Single-MOSFET Cells Using Nitride Spacers With Gate-to-Drain NOI," IEEE Transactions on Electron Devices, vol. 51, No. 11, Nov. 2004, pp. 1811-1817.

(Continued)

*Primary Examiner* — Cuong B Nguyen
*Assistant Examiner* — Khatib A Rahman
(74) *Attorney, Agent, or Firm* — Yee Tze Lim; .Hoffman Warnick LLC

(57) ABSTRACT

The disclosure provides a structure including a transistor coupled to terminals for injecting charge carriers into a pair of spacers. The structure includes a gate structure over a substrate and having a pair of spacers on opposite horizontal ends of the gate structure. A pair of source/drain (S/D) regions is within the substrate, and each S/D region is below a respective one of the pair of spacers. Each of the pair of S/D regions is coupled to one of a pair of terminals configured to inject charge carriers into either of the pair of spacers.

17 Claims, 5 Drawing Sheets

(56) References Cited

U.S. PATENT DOCUMENTS

| | | | | |
|---|---|---|---|---|
| 2008/0290401 | A1* | 11/2008 | Yasui | H10D 30/69 257/324 |
| 2014/0269111 | A1* | 9/2014 | He | G11C 16/16 365/189.011 |
| 2014/0299930 | A1* | 10/2014 | Park | H10B 43/30 257/314 |
| 2019/0221257 | A1* | 7/2019 | Jeng | G11C 16/0466 |
| 2024/0379747 | A1* | 11/2024 | Tsai | H10D 62/115 |

OTHER PUBLICATIONS

Anonymous, "NVM Cell Physics," NSCore, retrieved from: http://www.nscore.com/technology/nvm-cell-physics/ on Jan. 3, 2023, 3 pages.

* cited by examiner

TRANSISTOR COUPLED TO TERMINALS FOR INJECTING CHARGE CARRIERS INTO PAIR OF SPACERS

BACKGROUND

1. Technical Field

The present disclosure provides integrated circuit structures with a transistor coupled to terminals for injecting charge carriers into a pair of spacers, and methods for operating such structures.

2. Background Art

Non-volatile memory (NVM) devices that employ charge-trapping layers to store data have been developed. Once such NVM device is a charge-trapping sidewall spacer-type NVM (CTSS-NVM) device, which is configured similarly to a field effect transistor (FET) and employs a charge-trapping gate sidewall spacer for storing a data bit. Depending upon the biasing conditions applied to a gate structure of the device and its source/drain (S/D) regions, a charge can be forced into one charge-trapping dielectric layer of the data storage node (i.e., the CTSS-NVM device is programmed or, more particularly, stores a "one" data bit), a charge can be removed from the charge-trapping dielectric layer of the data storage node (i.e., the CTSS-NVM device is erased or, more particularly, stores a "zero" data bit), or the state of the CTSS-NVM device, as programmed or erased, can be read. Unfortunately, with technology scaling, the high voltage magnitudes needed to program and reset CTSS-NVM devices have become problematic.

SUMMARY

The illustrative aspects of the present disclosure are designed to solve the problems herein described and/or other problems not discussed.

Embodiments of the disclosure provide a structure including: a gate structure over a substrate and having a pair of spacers on opposite horizontal ends of the gate structure; and a pair of source/drain (S/D) regions within the substrate and each below a respective one of the pair of spacers, wherein each of the pair of S/D regions is coupled to one of a pair of terminals configured to inject charge carriers into either of the pair of spacers.

Further embodiments of the disclosure provide a structure including: a substrate; a pair of source/drain (S/D) terminals within the substrate, wherein a channel region of the substrate separates the pair of S/D terminals from each other; a gate structure over the channel region of the substrate and extending horizontally between a first end and a second end; a first spacer adjacent the first end of the gate structure and over one of the pair of S/D terminals; and a second spacer adjacent the second end of the gate structure and over the other of the pair of S/D terminals; wherein each of the pair of S/D regions is coupled to a respective terminal configured to inject charge carriers into either of the pair of spacers.

Additional embodiments of the disclosure provide a method for operating a structure, the method including: applying a voltage to one of a pair of source/drain (S/D) regions of a transistor, the transistor including: a gate structure over a substrate and having a pair of spacers on opposite horizontal ends of the gate structure; and the pair of source/drain (S/D) regions within the substrate and each below a respective one of the pair of spacers, wherein the voltage injects charge carriers into one of the pair of spacers; and applying the voltage to the other of the pair of S/D regions of the transistor to inject charge carriers into the other of the pair of spacers.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
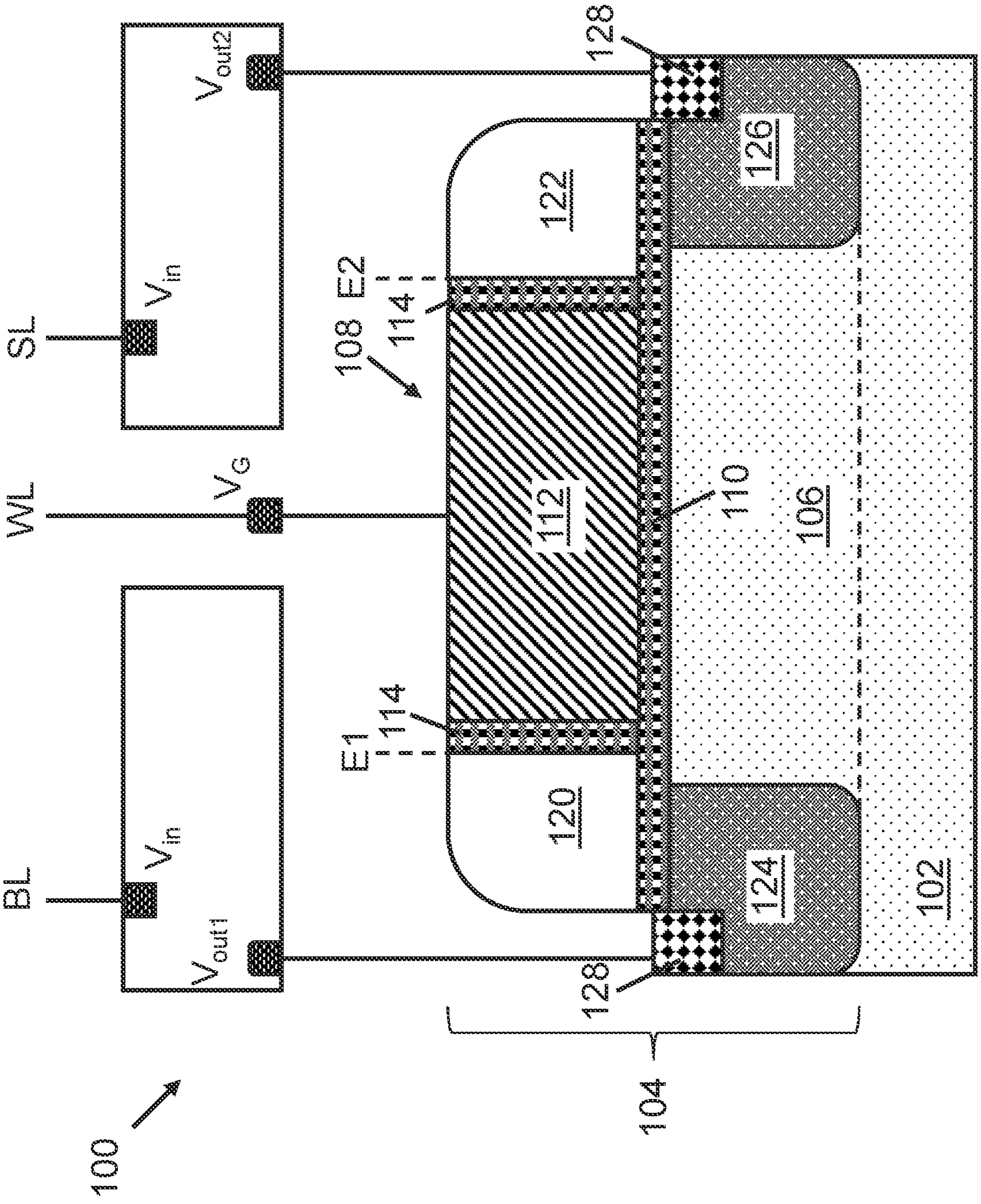
FIG. 1 depicts a cross-sectional view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Non-volatile memory (NVM) devices that employ charge-trapping layers to store data have been developed. Once such NVM device is a charge-trapping sidewall spacer-type NVM (CTSS-NVM) device, which is configured similarly to a field effect transistor (FET) and employs a charge-trapping gate sidewall spacer for storing a data bit. An example CTSS-NVM device may include a channel region within a semiconductor layer and positioned laterally between a first source/drain (S/D) region and a second (S/D) region. A gate structure may be on the semiconductor layer above the channel region, and first and second gate spacers may be on opposing sidewalls of the gate structure (e.g., adjacent to the first and second S/D regions, respectively). In a structure according to the disclosure, each of two S/D regions within a substrate may be located below a respective one of two spacers positioned on opposite horizontal ends of a gate structure. Each S/D region is coupled to one of two terminals configured to inject charge carriers into either of the pair of spacers, e.g., by applying the voltage to one of the two S/D regions.

Referring to FIG. 1, disclosed herein are embodiments of a semiconductor structure 100 (simply "structure" hereafter) for providing, e.g., a charge-trapping sidewall spacer-type non-volatile memory (CTSS-NVM) transistor in which charge carriers may be injected into either or both of two spacers by electrically controlling two terminals. Structure 100 can include a semiconductor substrate 102 (e.g., a silicon substrate) including, e.g., one or more bulk semiconductor area(s) (e.g., bulk silicon area(s)) and/or one or more semiconductor-on-insulator areas (e.g., silicon-on-insulator (SOI) area(s)) adjacent to the bulk semiconductor area(s). Substrate 102 is illustrated as a bulk semiconductor layer, but this is not required in all implementations. Various portions of a transistor 104 may be formed on and within upper portions of substrate 102.

Substrate 102 may include a channel region 106, extending to a predetermined depth below its upper surface. Channel region 106 can be either undoped or doped so as to have a first-type conductivity at a relatively low conductivity level. Transistor 104 further may include a gate structure 108 on channel region 106 of substrate 102. Gate structure 108 may include one or more gate dielectric layers 110 and one or more gate conductor layers 112 on the gate dielectric layer(s) 110.

Gate dielectric layer(s) 110 may include, e.g., a thin silicon dioxide ($SiO_2$) layer above and immediately adjacent to the top surface of the semiconductor substrate 102 and a thin high-K dielectric layer on the $SiO_2$ layer. Gate dielectric layer 110 may be a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.). Gate conductor layer(s) 112 can include a thin titanium nitride (TiN) layer on gate dielectric layer 110, and an amorphous silicon (A-Si) layer on the TiN layer. It should be understood that gate dielectric layer 110 and gate conductor layer(s) 112 are discussed for the sake of example and are not intended to be limiting. Alternatively, any other suitable gate dielectric and conductor material layer compositions could be incorporated into gate structure 108 of the transistor 104. Gate structure 108 moreover may include a set of gate spacers 114 horizontally adjacent gate conductor layer(s) 112. Gate spacers 114, where included, may include the same material and/or similar materials to those of gate dielectric layer 110.

In any case, gate structure 108 can further have opposing sidewalls (i.e., a first sidewall E1 and a second sidewall E2 opposite first sidewall E1). The opposing sidewalls E1, E2 of gate structure 108 can extend vertically away from the upper surface of semiconductor substrate 102 in such that they are essentially parallel to each other and essentially perpendicular to the upper surface of semiconductor substrate 102. The terms "essentially parallel" and "essentially perpendicular" are used to account for processing variations that: (a) may result in sidewalls E1, E2 being somewhat angled relative to the top surface of substrate 102 (e.g., at 90 degrees plus or minus 0-20 degrees) as opposed to exactly perpendicular; (b) may result in sidewalls E1, E2 being somewhat curved as opposed to being exactly planar; and/or (c) may result in the top surface of substrate 102 not being exactly planar.

Transistor 104 can further include a set of spacers 120, 122 each adjacent one of the sidewalls E1, E2 of gate structure 108. Specifically, a first spacer 120 may be positioned laterally immediately adjacent to first sidewall E1 of gate structure 108, and a second spacer 122 may be positioned laterally immediately adjacent to second sidewall E2 of gate structure 108. Each spacer 120, 122 may be formed of a charge trapping material, e.g., silicon nitride (SiN), polysilicon, hafnium-based oxides (e.g., $HfO_2$, HfAlO, etc.), and/or other charge trapping materials currently known or later developed. In some embodiments, spacers 120, 122 may have a same material composition. Spacers 120, 122 may be similarly or substantially identically sized (e.g., they may be substantially symmetric), although this is not required in all implementations. Spacers 120, 122, however embodied, may be programmed independently of each other by way of circuitry connected to transistor 104 according to various methods discussed herein.

Each spacer 120, 122 can include one or more layers of material, including one or more layers of charge trapping material as discussed above, positioned laterally immediately adjacent to a respective sidewall E1, E2 of gate structure 108. This layer of spacer material may extend upward away from semiconductor substrate 102 such that it covers its adjacent sidewall E1, E2. Each spacer material may include one or more dielectric materials, e.g., a high-K dielectric material. For purposes of this disclosure, a "high-K dielectric material" refers to a dielectric material with a dielectric constant that is at least equal to that of silicon nitride (e.g., 7.0 or more). In any case, the spacer(s) 120, 122 can, in total, be relatively thin such that the maximum width of each spacer 120, 122 is, e.g., between approximately two nanometers (nm) and approximately twenty nm.

Transistor 104 further may include a first S/D region 124 and a second S/D region 126 within substrate 102. Each S/D region 124, 126 can be a doped portion of semiconductor material within substrate 102, or in further implementations may include an epitaxial semiconductor layer formed on underlying portions of substrate 102. S/D regions 124, 126 in any case may be adjacent channel region 106. S/D regions 124, 126 may have an opposite doping type with respect to other portions of substrate 102. For instance, S/D regions 124, 126 may be doped with a N-type dopant so as to have a N-type conductivity at a relatively high conductivity level. Substrate 102 by contrast, particularly in channel region 106, can be either undoped or doped with a P-Type dopant so as to have an P-type conductivity at a relatively low conductivity level, thus defining a n-type or "NFET" structure. It is understood that these doping types may be reversed in other implementations (e.g., to provide an p-type or "PFET" structure). To provide stronger electrical contact between S/D regions 124, 126 and any conductive contacts formed thereto, S/D regions 124, 126 each may include a silicide region 128 formed by depositing a layer of metal on S/D region(s) 124, 126, annealing the deposited metal such that it reacts with the underlying semiconductor material to form conductive metal silicide regions, and removing any unreacted metal after the annealing concludes.

Gate structure 108, however embodied, may have dimensions of a sufficient size for spacers 120, 122 adjacent thereto to be programmed independently of each other. Such dimensions may be any width and length of sufficient size to prevent charge carriers injected from only one S/D region 124, 126 from passing into both spacers 120, 122. For example, gate structure 108 may have a width-to-length ratio of between approximately 1.3 and approximately 1.5. In further implementations, gate structure 108 may have a width (e.g., a horizontal thickness within the plane of the page) of approximately 270 nanometers (nm) and a length (e.g., a horizontal thickness extending into and/or out of the plane of the page) of approximately 200 nm.

Each S/D region 124, 126 may be electrically coupled (e.g., through silicide regions 128) to a circuit 130, e.g., through a combination of metal wires, vias, and/or a combination of other electrical connections. Circuit(s) 130 coupled to each S/D region 124, 126 may be individual assemblies and/or components, or may be respective portions of one circuit 130. Circuits 130 in some cases may take the form of a charge pump 132, i.e., a circuit configuration that converts a direct current (DC) input voltage to an output DC voltage having a higher or lower magnitude than the input. Circuit(s) 130 and/or charge pump(s) 132 may be coupled to other components for operating a memory array, e.g., circuit(s) 130 may couple first S/D region 124 to a bit line (BL) and circuit(s) 130 may couple second S/D region 126 to a source line (SL). In conventional one-transistor memory assemblies, SL may directly couple a source or drain of the transistor to ground. In embodiments of the disclosure, however, either S/D region 124, 126 may be set to a predetermined voltage or ground to enable charge trapping in either or both of spacers 120, 122.

In the case of a charge pump 132, circuit 130 may include an array of capacitors, amplifiers, etc., for coupling an input terminal Vin to a set of output terminals $V_{out1}$, $V_{out2}$. The internal components of charge pump 132, are not specifically shown in FIG. 1 as they are generally understood in the art. Output terminals $V_{out1}$, $V_{out2}$, regardless of the composition of circuit 130, can be set to a relatively high "memory voltage" relative to the operating voltage(s) of other portions of circuit 130 and/or portions of a device coupled thereto. The voltage of each output terminal $V_{out1}$, $V_{out2}$ can be independently controlled, such that their voltage levels may be the same or different. Circuit 130 and/or charge pump 132, in various examples, may be capable of yielding a memory voltage at terminals $V_{out1}$, $V_{out2}$ of a magnitude of, e.g., approximately five volts (V) or similar amounts that exceed the operating voltage of other devices and/or components on substrate 102. Circuit 130 and/or charge pump 132 may have an additional node $V_G$ which may be coupled to a word line (WL) of the memory array. Word line WL may be operated to selectively apply a voltage for operating gate structure 108 of transistor 104 at additional node $V_G$ to enable or disable current flow through channel region 106. Additional node $V_G$ is depicted as being separate from or not coupled to circuit 130 and/or charge pump 132, but it may be coupled to circuit(s) 130 and/or charge pump(s) 132 in other implementations. The voltage for operating transistor 104 applied at additional node $V_G$ may be of higher magnitude than the memory voltage applied output terminals $V_{out1}$, $V_{out2}$, e.g., it may be approximately seven V in the case where output terminals $V_{out1}$, $V_{out2}$ are programmed using voltage magnitudes of approximately three V or five V.

Figure 2:
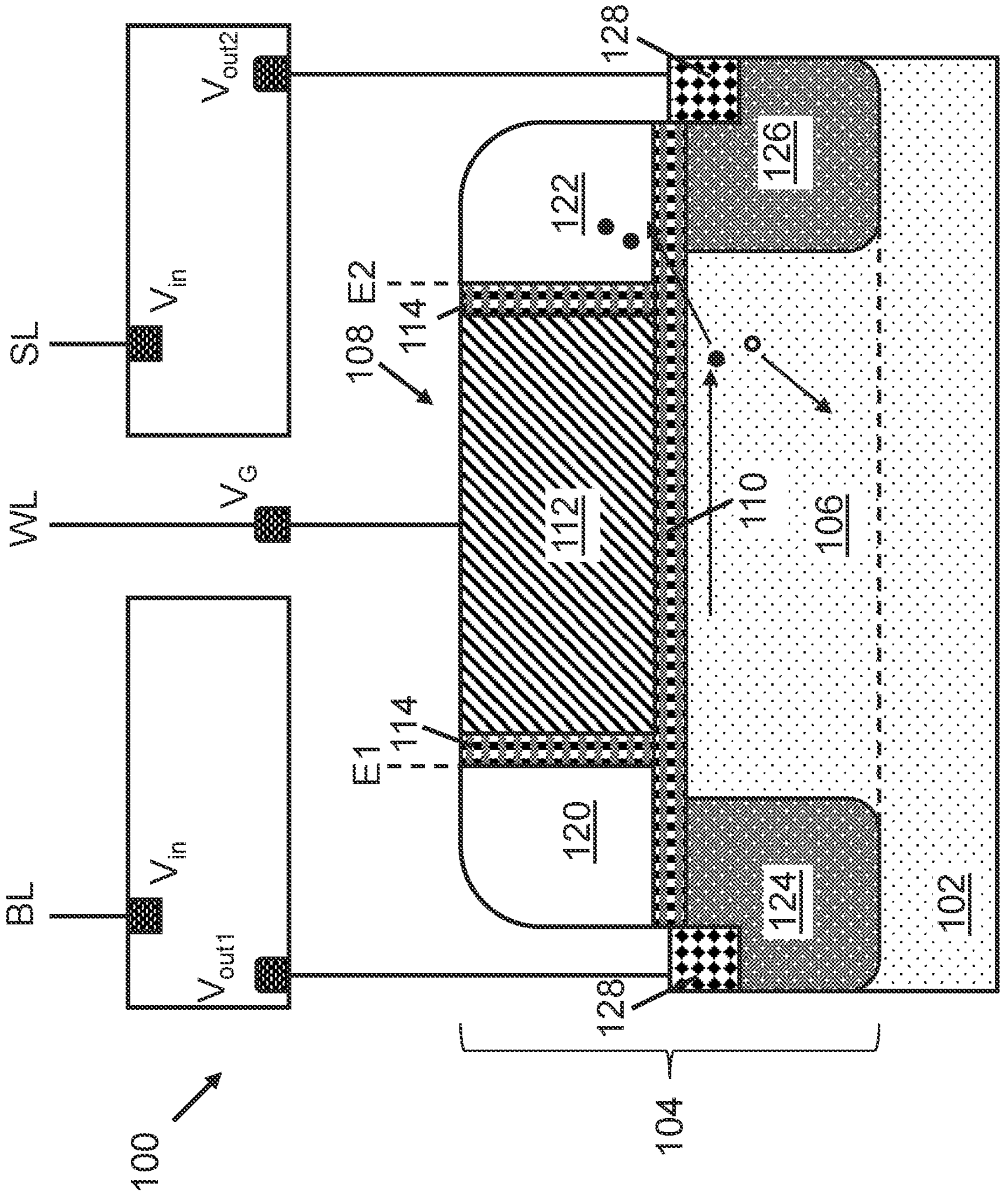
FIG. 2 depicts a cross-sectional view of injecting charge carriers into one spacer of the structure according to embodiments of the disclosure.

Turning to FIG. 2, circuit 130 of structure 100 may operate to program one spacer 120, 122 of transistor 104 independently of the other as discussed herein. This feature is a contrast to conventional one-transistor memory devices, as such device conventionally allow charge carriers to only be stored within one spacer while not permitting data to be stored in the other spacer. To program only second spacer 122, an operator of structure 100, including circuit 130 and/or charge pump 132, may set first output terminal $V_{out2}$ to a predetermined voltage (e.g., five V or other amount), simultaneously setting second output terminal $Vout_1$ to zero V and additional node $V_G$ to a predetermined amount (e.g., seven V) to enable current flow between S/D regions 124, 126. In this case, the high voltage being applied to first S/D region 126 (e.g., the drain side of transistor 104) will cause charge carriers to pass through channel region 106 and induce "hot carrier injection" into second spacer 122.

Hot carrier injection is shown in FIG. 2 via the black dots indicating charge carriers and corresponding white dots indicating holes. Hot carrier injection refers to an instance where a charge carrier (e.g., an electron) attains sufficient energy to overcome a potential barrier, and thus break an interface state for the particle to donate the charge carrier. The term "hot" refers to the high temperatures needed to model carrier density, and not to the operating temperature of a material undergoing hot carrier injection. In the case of a transistor, charge carriers becoming trapped gate dielectric material ordinarily may permanently affect and damage the operation affect the switching characteristics of a transistor. By including spacer(s) 120, 122, hot carrier injection can instead be used to store and retrieve a charge via the spacer 120, 122 material. Thus, embodiments of structure 100 allow transistor 104 to function as a memory device by enabling charge capture and removal in either or both spacers 120, 122.

Figure 3:
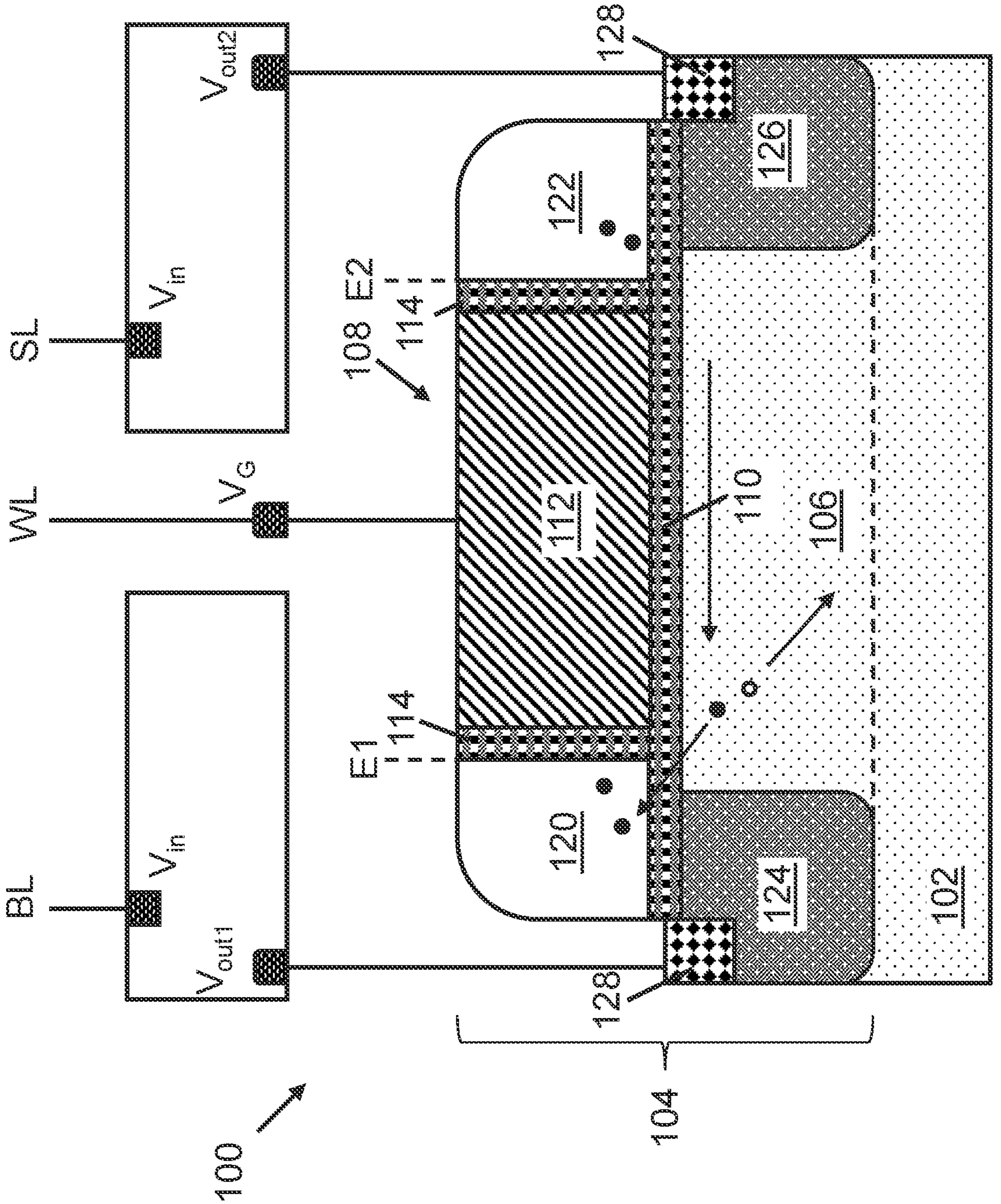
FIG. 3 depicts a cross-sectional view of injecting charge carriers into the other spacer of the structure according to embodiments of the disclosure.

FIG. 3 depicts an example for further programming of transistor 104 in the case where charge carriers have already been injected into second spacer 122. Although the programming of first spacer 120 may occur after the programming of second spacer 122, the order of these operations may be reversed, and/or one programming operation may be performed without the other. Here, first spacer 120 is programmable independent of second spacer 122 by using circuit 130 and/or charge pump 132 to set first output terminal $V_{out2}$ to zero V while setting second output terminal $V_{out1}$ to a predetermined voltage (e.g., five V or other amount). Additional node $V_G$ simultaneously may be set to another voltage (e.g., seven V as discussed herein) to enable current flow between S/D regions 124, 126. Unlike the programming of second spacer 122, the memory voltage being applied to first S/D region 124 will cause charge carriers to pass through channel region 106 and induce "hot carrier injection" into first spacer 120 at the opposite horizontal end from S/D region 126. FIG. 3 depicts electrons being injected into first spacer 120 while previously injected charge carriers of second spacer 122 remain within second spacer 122. Regardless of which spacer(s) 120, 122 hold charge carriers therein, the memory state of transistor 104 is readable by applying a voltage to node $V_G$ and simultaneously to 124 and 126. During a read operation, the voltage applied to S/D region 126 may be a low voltage (e.g., approximately 1.2 V) to avoid causing further hot carrier injection and voltage on S/D region 124 when it is set to ground, or vice versa.

Figure 4:
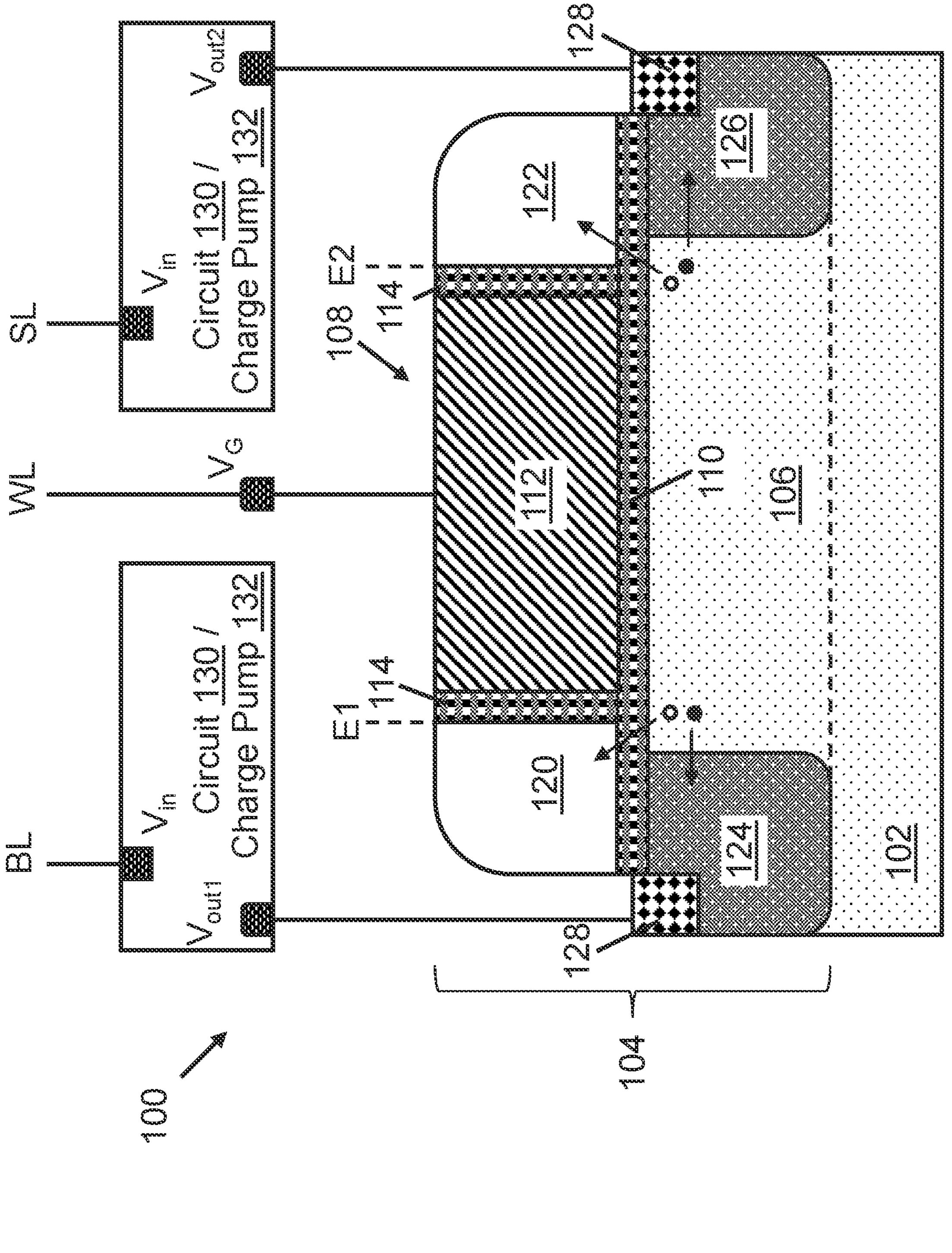
FIG. 4 depicts a cross-sectional view of removing charge carriers from the spacers of the structure according to embodiments of the disclosure.

FIG. 4 depicts an example of an erase operation, e.g., to remove stored charge carriers from either or both of spacers 120, 122. Although the erase operation may remove charge carriers from spacers 120, 122 simultaneously, it is possible for the same operation to remove charge carriers from only one spacer 120, 122. According to embodiments, circuit 130 and/or charge pump 132 may set additional node $V_G$ to an inverted voltage (e.g., negative seven V) and simultaneously setting output terminals $V_{out1}$, $V_{out2}$ to a predetermined "erase voltage," which may be of lesser magnitude than the memory voltage. According to one example, the erase operation may include setting output terminals $V_{out1}$, $V_{out2}$ to an erase voltage of approximately three V. The positive-to-negative voltage differential between spacers 120, 122 and channel region 106 induced by these applied voltages may cause holes to be injected into spacers 120, 122, thus neutralizing the accumulated charge carriers stored therein. These programming and erasing features of structure 100 may produce a memory element having substantially reduced programming time as compared to conventional one-sided programmable transistors. In various examples, transistor 104 may be programmable within a time span of approximately ten microseconds, as compared to one millisecond for conventional programmable transistors.

Figure 5:
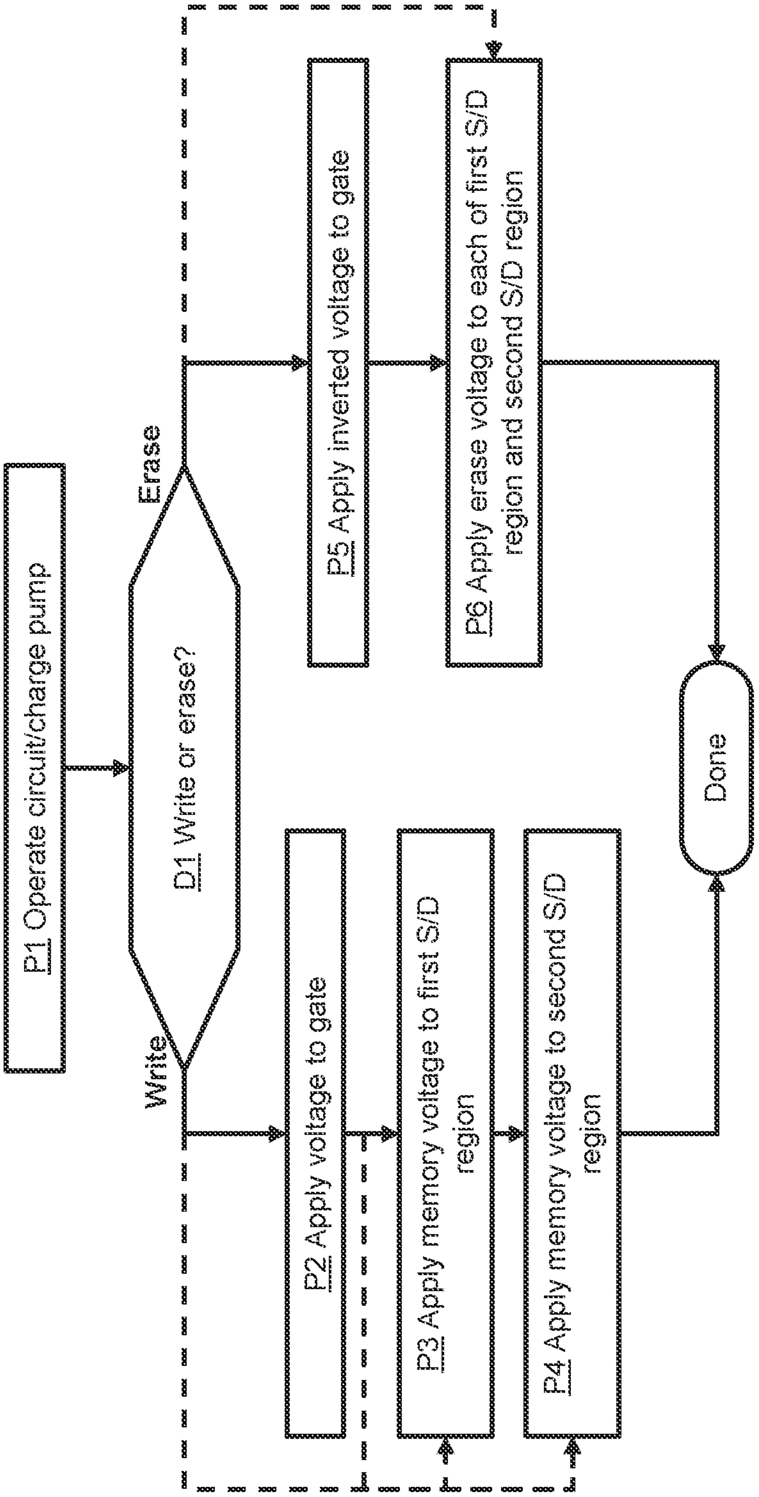
FIG. 5 provides an illustrative flow diagram depicting an example method for operating the structure according to embodiments of the disclosure.

Referring to FIG. 5 with reference to FIG. 1, an example flow diagram for implementing a method according to embodiments of the disclosure is provided. In process P1, methods of the disclosure include operating circuit 130 and/or charge pump 132, e.g., by placing circuit 130 and/or charge pump 132 into an ON state. During such operation, internal logic of circuit 130 and/or devices coupled to charge pump 132 may determine at decision D1 whether to perform a write operation or an erase operation on transistor 104. In the case of a write operation (i.e., "Write" at decision D1), the method may proceed to process P2 of applying a voltage to gate structure 108 of transistor 104, e.g., using additional node $V_G$ as discussed herein. Either or both of processes P3 and P4 then may be used to inject charge carriers into (and thus program) first spacer 120 or second spacer 122, by applying the memory voltage to S/D region 124, 126 discussed herein. Hence, process P3 may include applying the memory voltage to first S/D region 124 to inject charge carriers into first spacer 120 whereas process P4 may include applying the memory voltage to second S/D region 126 to inject charge carriers into second spacer 122. As indicated by dashed lines, some implementations may omit process P2, e.g., where a voltage is applied to transistor 104 independently of any action by circuit 130 and/or charge pump 132. The method then may conclude ("Done") or return to process P1 to continue operating circuit 130 and/or charge pump 132 until another write or erase operation is implemented.

In the case of an erase operation (i.e., "Erase" at decision D2), the method may continue to process P5 of applying the inverted voltage to gate structure 108 of transistor 104. In some implementations, process P5 may be omitted because components other than circuit 130 and/or charge pump 132 apply the inverted voltage to gate structure 108. In any case, the method may continue to process P6 of applying the erase voltage simultaneously to first S/D region 124 and second S/D region 126 to inject holes into spacer(s) 120, 122, thus neutralizing any accumulated charge therein. The method then may conclude ("Done") or return to process P1 until another write or erase operation is implemented. Thus, embodiments of the disclosure are operable to use source line SL/bit line BL for programming by applying a positive or grounding voltage to transistor 104 using via source line SL. The program and erase voltages may be applied to selected transistor(s) 104, which may be connected to a row control block that includes word line drivers. Similarly, source line SL and bit line BL may be connected to a column control block that includes drivers for each line SL, BL.

Embodiments of the disclosure provide various technical and commercial advantages, examples of which are discussed herein. By allowing spacers 120, 122 of transistor 104 to be injected with charge carriers independently of each other, the memory voltage(s) needed to program transistor 104 may be lower or the time needed to program transistor 104 may be shorter than what is needed to program conventional CTSS-NVM devices. These lower voltages or shorter program time may also allow an operator of structure 100 to tune the programming and erase voltages of transistor 104 to suit a wide variety of applications. Transistor 104, in some cases, optionally may be implemented by causing only one of two spacers 120, 122 to have charge carriers injected therein, even though programming of both spacers 120, 122 remains possible.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:

a gate structure over a substrate and having a pair of spacers on opposite horizontal ends of the gate structure;

a pair of source/drain (S/D) regions within the substrate and each below a respective one of the pair of spacers, wherein each of the pair of S/D regions is coupled to one of a pair of terminals configured to inject charge carriers into either of the pair of spacers; and a circuit coupled to the pair of S/D regions and configured to:

apply a memory voltage to only one of the pair of S/D regions to accumulate charge carriers in one of the pair of spacers; and apply an erase voltage to each of the pair of S/D regions simultaneously to neutralize accumulated charge carriers in each of the pair of spacers.

2. The structure of claim 1, wherein the pair of spacers have a same material composition.

3. The structure of claim 2, wherein the same material composition includes a nitride or a polysilicon.

4. The structure of claim 1, further comprising a gate dielectric layer vertically between one of the pair of S/D regions and a respective one of the pair of spacers.

5. The structure of claim 4, further comprising a pair of gate spacers each horizontally between the gate structure and a respective one of the pair of spacers.

6. The structure of claim 1, wherein the pair of spacers of the gate structure are substantially identically sized.

7. The structure of claim 1, wherein the pair of S/D regions include a silicide region.

8. The structure of claim 1, wherein the circuit couples one of the pair of S/D regions to a bit line.

9. The structure of claim 8, wherein the circuit couples the other one of the pair of S/D regions to a source line.

10. A structure comprising:

a substrate;

a pair of source/drain (S/D) regions within the substrate, wherein a channel region of the substrate separates the pair of S/D regions from each other;

a gate structure over the channel region of the substrate and extending horizontally between a first end and a second end;

a first spacer adjacent the first end of the gate structure and over one of the pair of S/D regions;

a second spacer adjacent the second end of the gate structure and over the other of the pair of S/D regions;

wherein each of the pair of S/D regions is coupled to a respective terminal configured to inject charge carriers into either of the pair of spacers; and a circuit coupled to the pair of S/D regions and configured to:

apply a memory voltage to only one of the pair of S/D regions to accumulate charge carriers in one of the pair of spacers; and apply an erase voltage to each of the pair of S/D regions simultaneously to neutralize accumulated charge carriers in each of the pair of spacers.

11. The structure of claim 10, wherein the first spacer and the second spacer have a same material composition.

12. The structure of claim 11, wherein the same material composition includes a nitride or a polysilicon.

13. The structure of claim 10, further comprising a gate dielectric layer vertically between the substrate and each of the gate structure, the first spacer, and the second spacer.

14. The structure of claim 10, wherein the first spacer and the second spacer are substantially identically sized.

15. The structure of claim 10, wherein the pair of S/D regions include a silicide region.

16. The structure of claim 10, wherein the circuit couples one of the pair of S/D regions to a bit line.

17. The structure of claim 16, wherein the circuit couples the other one of the pair of S/D regions to a source line.

* * * * *